(12) United States Patent
Fujita

(10) Patent No.: US 6,183,890 B1
(45) Date of Patent: Feb. 6, 2001

(54) MAGNETO-RESISTANCE EFFECT DEVICE AND METHOD OF MANUFACTURING THE SAME

(75) Inventor: Jun-Ichi Fujita, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/176,797

(22) Filed: Oct. 22, 1998

(30) Foreign Application Priority Data

Oct. 23, 1997 (JP) .................................................. 9-291339

(51) Int. Cl.⁷ ...................................................... G11B 5/66
(52) U.S. Cl. ................................. 428/692; 428/694 TR; 428/694 R; 428/694 TS; 428/141; 428/900; 360/113; 427/128; 427/129; 427/130
(58) Field of Search ............................. 428/692, 694 TR, 428/694 R, 694 TS, 141, 900; 360/113; 427/128–130

(56) References Cited

U.S. PATENT DOCUMENTS

| | | | |
|---|---|---|---|
| 5,463,516 | * 10/1995 | Valet | 360/113 |
| 5,585,196 | 12/1996 | Inomata et al. | 428/557 |
| 5,585,198 | 12/1996 | Maeda et al. | 428/611 |
| 5,738,929 | 4/1998 | Maeda et al. | 428/141 |

FOREIGN PATENT DOCUMENTS

| | | |
|---|---|---|
| 0629998 A2 | 12/1994 | (EP) . |
| 6-97534 | 4/1994 | (JP) . |
| 6-318749 | 11/1994 | (JP) . |
| 7-312312 | 11/1995 | (JP) . |
| 8-225871 | 9/1996 | (JP) . |
| 9-107136 | 4/1997 | (JP) . |
| 9-116212 | 5/1997 | (JP) . |

OTHER PUBLICATIONS

Ootuka et al., "A new fabrication method of ultra small tunnel junctions", Third Int'l Symposium . . . Dec. 4–8, 1995 vol. 227, p.p. 307–309.

Dieny et al., Magnetotransport properties of magnetically soft spin–valve structures (invited), J. Applk. Physics, vol. 69, No. 8, (1991), pp 4775–4779.

Baibich et al., Giant Magnetroresistance of (001) Fe/(001)Cr Magnetic Superlattices, Physical Review Letter, vol. 61, No. 21, (1988), pp 2472–2475.

* cited by examiner

Primary Examiner—Leszek Kiliman
(74) Attorney, Agent, or Firm—Foley & Lardner

(57) ABSTRACT

In a magneto-resistance effect device including a plurality of magnetic dots each of which is formed by magnetic material on a substrate and appears a magneto-resistance effect by applying an external magnetic field, the magnetic dots are arranged on the substrate in a two-dimensional array. The two-dimensional array has a plurality of rows along a column direction and a plurality of columns along a row direction. The magnetic dots include at least first magnetic dots and second magnetic dots. The first magnetic dots are arranged on first rows while the second magnetic dots are arranged on second rows. The first magnetic dot is different from the second magnetic dot in shape.

20 Claims, 8 Drawing Sheets

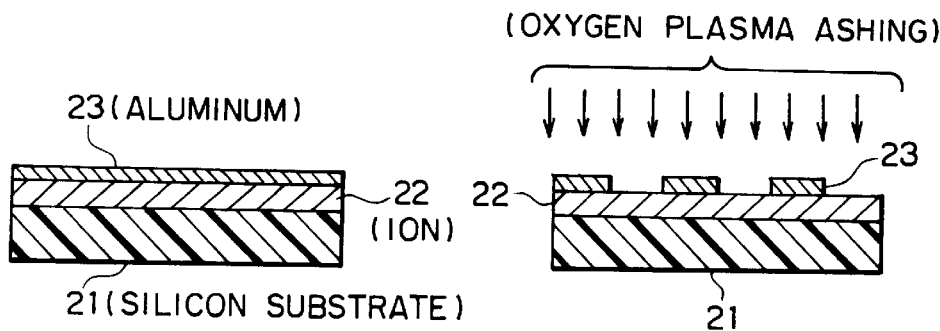
FIG. 6A
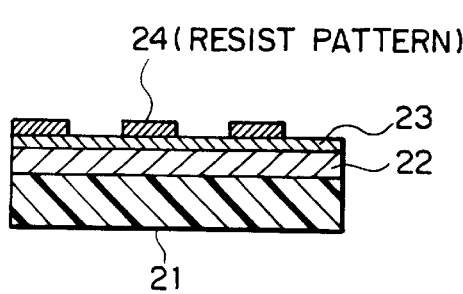
FIG. 6B
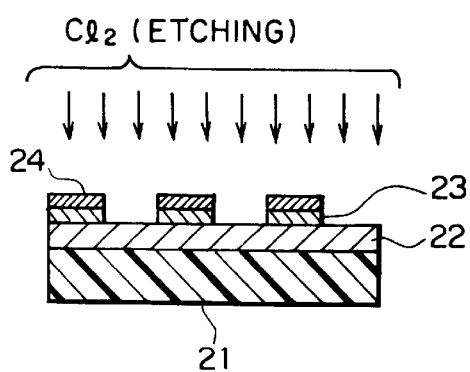
FIG. 6C
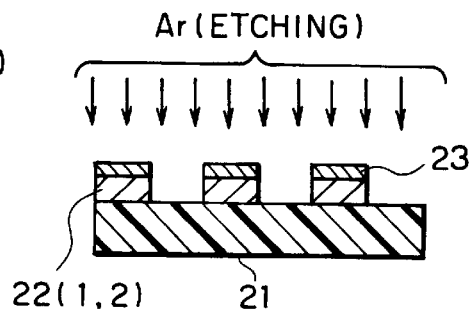
FIG. 6D
FIG. 6E
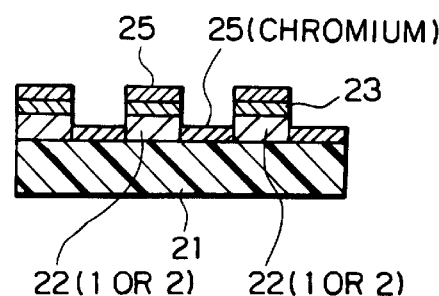
FIG. 6F

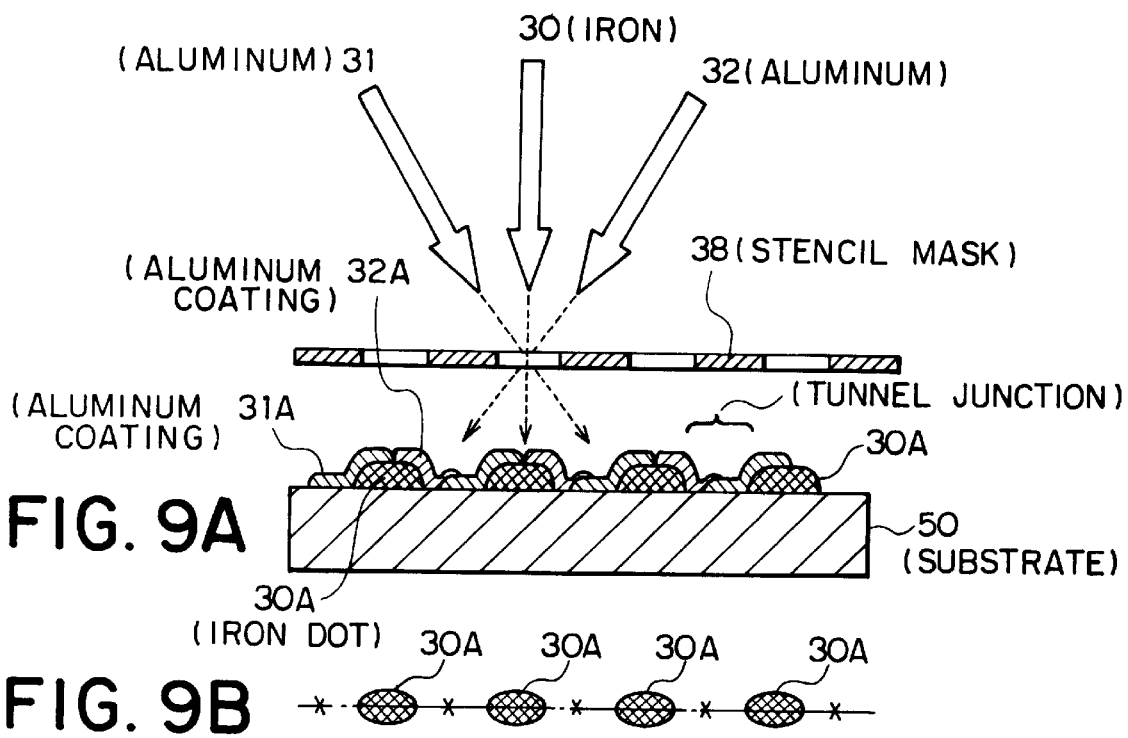
FIG. 9A
FIG. 9B
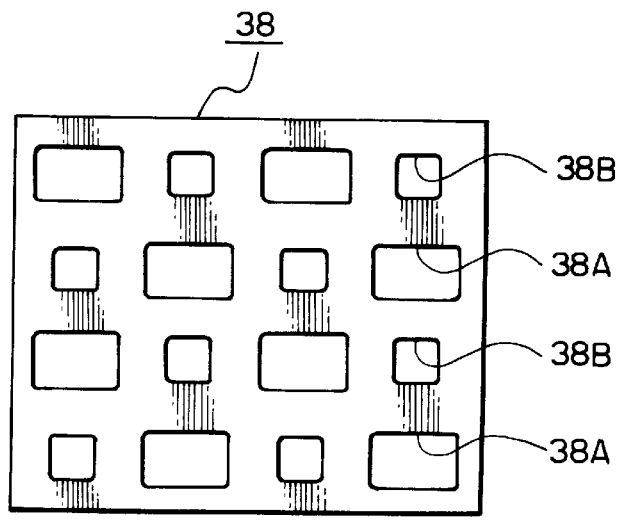
FIG. 10

MAGNETO-RESISTANCE EFFECT DEVICE AND METHOD OF MANUFACTURING THE SAME

BACKGROUND OF THE INVENTION

This invention relates to a magneto-resistance effect device (namely, an MR device), and in particular, to a magneto-resistance effect device which is capable of reproducing a desired recording information from a magnetic recording medium by the use of the magneto-resistance effect.

A magneto-resistance effect device (namely, an MR device) of the type described conventionally and widely has been used for a magnetic sensor, a magnetic head and an large-scale integrated circuit (namely, an LSI) memory.

Recently, a giant magneto-resistance (namely, GMR) effect has been developed, and has been widely applied for the industry field.

In this event, it has been conventionally and widely known that the spin scattering causes the magneto-resistance effect. Specifically, the phenomenon regarding the spin scattering results from the fact that an electron of up-spin has low scattering probability for an electron of the up-spin, and has high scattering probability for an electron of downspin.

In other words, the up-spin electron has low scattering probability in a magnetic domain of the up-spin while it has high scattering probability in different magnetic domain. As a result, the magneto-resistance effect takes place.

Therefore, it is required that a magnetization direction is variable in accordance with a change of a desired external magnetic field, and the domains of the up-spin and the down-spin coexist in the MR device in order to realize the MR effect in accordance with difference of the spin scattering. Namely, magnetization directions are different to each other in the respective domains.

In particular, when each magnetic domain has a magnetization direction of parallel opposite to each other, the MR effect indicates a maximum value. Therefore, it is important as a device parameter to realize the opposite parallel state under a low external magnetic field because the parameter relates to high sensitivity of the MR device.

Several methods have been so far reported in accordance with difference in structure to form the above-mentioned opposite parallel state.

For instance, devices, which utilize MR effect, are conventionally known, and are classified into (1) the MR devices formed by a granular film, (2) MR device formed by a metal multi-layer, (3) MR devices (magnetic bulb) of the spin-bulb type due to a sandwich structure via a tunnel barrier.

In the above-mentioned MR device formed by the granular film, ferromagnetic material, such as Fe, Co, and Ni, is precipitated or deposited in a non-magnetic layer, as disclosed in Japanese Unexamined Patent Publication No. Hei. 6-318749.

In this event, a precipitated state (namely, shape, size and direction of the precipitated particle) becomes irregular. More specifically, the precipitated particle has a long ellipse in accordance with a precipitated condition, and thereby, the size of the particle becomes random.

On the other hand, difference of one axis anisotropy or coercive force occurs for each precipitated particle by the randomness in size of the particles. Thereby, the MR effect brings about. At the same time, the magnetization is reversed under a low external magnetic field because the precipitated particle is small in size. In consequence, the MR device can operate under the low magnetic fields.

Subsequently, the MR effect due to the metal multi-layer has been disclosed in many papers. For example, the GMR effect caused by a multi-layer film consisting of iron and chromium is described in Physical Review Letter, 1998, volume 61, number 21, page 2472.

Further, the above-mentioned spin-bubble type MR device has been disclosed, for example, in Journal of Applied Physics, Aprl 1991, Vol. 69 (8), pages 4774–4779.

Specifically, MR devices having three layer structure have been suggested. In this case, the MR device utilizes the difference of the coercive force between a permalloy layer that is magnetically free and a permalloy layer that is magnetically pinned by a manganese layer.

However, ferromagnetic material, such as Fe, Co, and Ni, is precipitated in the non-magnetic electrical conductive layer in the conventional MR device of the granular type. In this event, it is difficult to control subtle differences of coercive force and precipitation particle density because the ferromagnetic material is naturally precipitated or deposited. In consequence, it is difficult to keep uniformity in manufacturing. As a result, the MR effect can not be essentially and sufficiently realized.

On the other hand, a large GMR effect of 200% or more at maximum is observed in the MR device of the metal multi-layer type. However, it is difficult to process the device because a current flows in a direction perpendicular to a plane.

Moreover, the resistance of the device is extremely low (approximately, several tens macro-ohm) because a practical device has a size of 0.24 micron in the perpendicular direction for the plane at several tens micron square.

In addition, an external magnetic field of several tesla is required to reverse the magnetization, and this is not a practical sensitivity.

Thus, there are a plurality of problems in putting conventional MR devices to practical use.

SUMMARY OF THE INVENTION

It is therefore an object of this invention to provide an MR device which is capable of artificially and readily controlling a magnetic domain of nano-meter size.

It is another object of this invention to provide an MR device which has high sensitivity and high gain.

According to this invention, a magneto-resistance effect device includes a plurality of magnetic dots. In this event, each of the magnetic dots is formed by magnetic material on a substrate and where a magneto-resistance effect occurs by applying an external magnetic field.

With such a structure, the magnetic dots are arranged on the substrate in a two-dimensional array. Herein, the two-dimensional array has a plurality of rows along a column direction and a plurality of columns along a row direction.

Further, the magnetic dots include at least first magnetic dots and second magnetic dots. In this case, the first magnetic dots are arranged on first rows while the second magnetic dots are arranged on second rows.

Under this circumstance, the first magnetic dot is different from the second magnetic dot in shape.

In this invention, the MR device having high sensitivity and high gain can be obtained because fine magnetic dots are arranged in the two-dimensional array. Further, the resistance of the MR device can be set to extremely high value as compared to the GMR device of the vertical plane type because the width of the device can be narrowed. For instance, the device resistance of the conventional laminate type MR device is micro-ohm per unit. In contrast, in the MR device according to this invention, device resistance of several hundreds-ohms can be obtained. Therefore, the MR device according to this invention has an advantage in matching with the LSI memory device.

As a result, the MR device according to this invention is applicable for a magnetic sensor itself, a magnetic head of a magnetic memory device, and a super high-integrated memory device of a data recording type, such as, a magnetic RAM.

BRIEF DESCRIPTION OF THE DRAWINGS

FIGS. 6A through 6F are cross sectional views showing steps for manufacturing the device illustrated in FIG. 5;

FIG. 9A is a schematic view showing another embodiment of this invention;

FIG. 9B is a schematic view showing an equivalent circuit of the device illustrated in FIG. 9A; and FIG. 10 is a plan view showing a stencil mask illustrated in FIG. 9A.

DESCRIPTION OF THE PREFERRED EMBODIMENTS

Referring to FIGS. 1 through 4, conventional MR devices will be first described for a better understanding of this invention. The MR devices are equivalent to the conventional MR devices mentioned in the preamble of the instant specification.

Figure 1A:
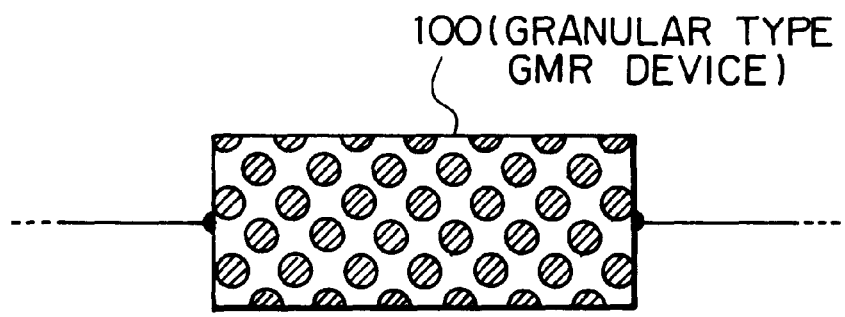
FIG. 1A is a schematic cross sectional view showing a conventional granular type GMR device.
Figure 1B:
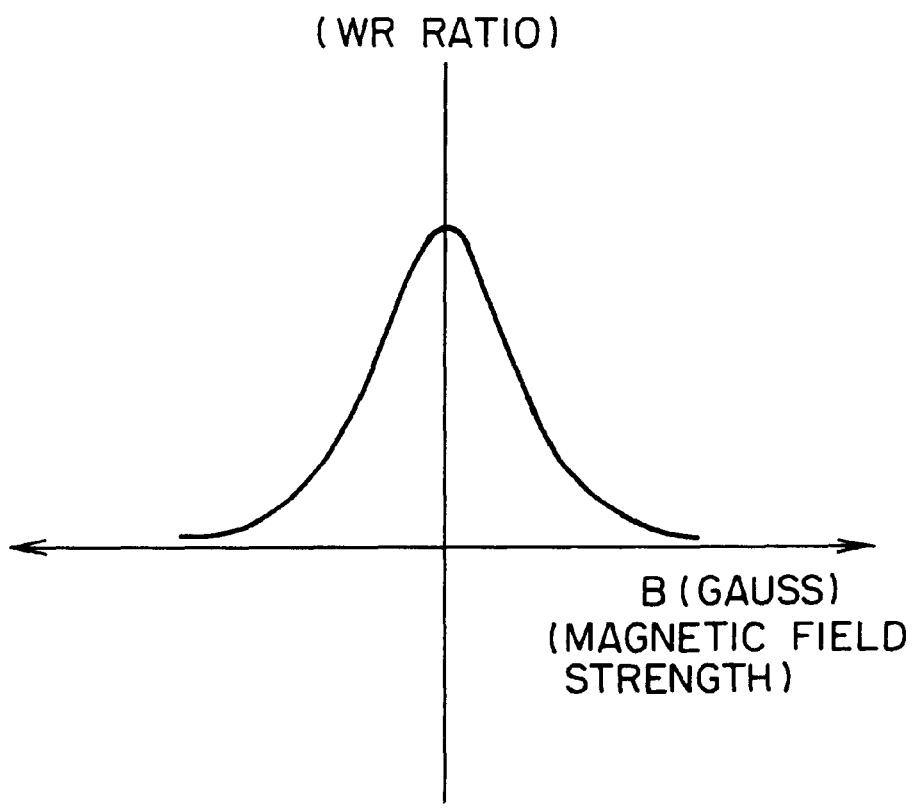
FIG. 1B is a diagram showing characteristic of the conventional MR device illustrated in FIG. 1A.

First, as shown in FIG. 1A, a size of precipitated or deposited particle falls within the range between about 1 nm and 50 nm in the granular type MR device 100. Further, a distance between particles falls within the range between about 1 nm and 10nm. The MR characteristic of the MR device is illustrated in FIG. 1B.

In this case, the MR device is manufactured by precipitating during cooling from a thermal equilibrium state from alloy. Alternatively, the MR device is fabricated by precipitating in a non-thermal equilibrium state during sputter vaporization.

In this condition, a precipitated state (namely, shape, size and direction of the precipitated particle) becomes irregular. More specifically, the precipitated particle has a long ellipse in accordance with the precipitated condition and thereby, the particles have random sizes.

On the other hand, difference of one-axis anisotropy or coercive force occurs for each precipitated particle by the randomness in size of each particle. Thereby, the MR effect brings about. At the same time, the magnetization is reversed under a low external magnetic field because the precipitated particle is small in size. In consequence, the MR device can operates under the low magnetic field.

Figure 2A:
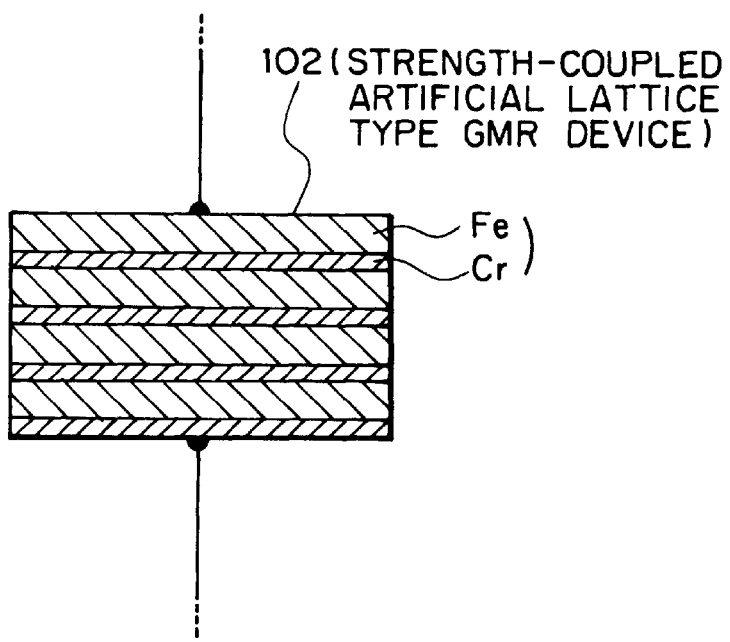
FIG. 2A is a schematic cross sectional view showing a conventional strongly coupled artificial type GMR device.

Subsequently, an artificial multi-layer structures the GMR device 102 illustrated in FIG. 2A. Herein, the artificial multi-layer is formed by alternately laminating extremely thin-films consisting of ferromagnetic iron (3 nm-thick) and non-magnetic chromium (0.9 nm-thick) 60 times.

Figure 2B:
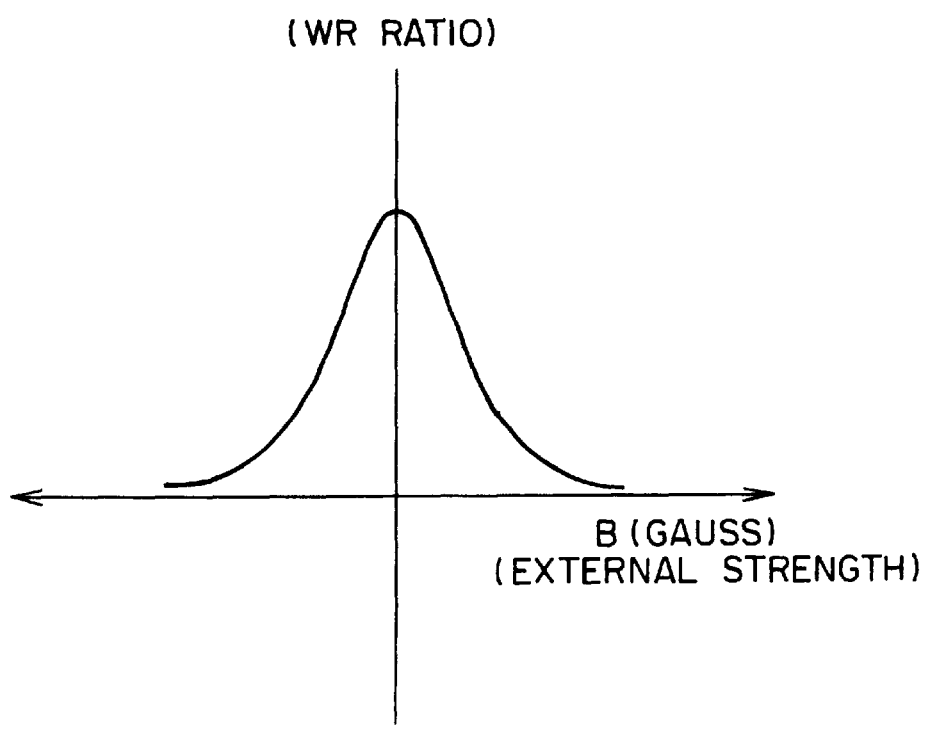
FIG. 2B is a diagram showing characteristic of the conventional MR device illustrated in FIG. 2A.

In this GMR device 102, the ferromagnetic iron (Fe) is separated by the non-magnetic chromium (Cr). However, the magnetization of the respective irons is magnetically coupled via the chromium layer because the thickness of the chromium is excessively thin. In this event, the MR characteristic of the MR device in FIG. 2A is illustrated in FIG. 2B.

With such a structure, the magnetization of the irons becomes opposite parallel at every one layer when the external magnetic filed is equal to zero. At this time, large magnetic resistance can be observed for a current which flows in a perpendicular direction for the film.

In this condition, when the external magnetic field parallel for each plane of the multi-layer is given, the magnetization of the iron layer is reversed so as to complete for the external magnetic field. When all of the iron layers are completed, the magnetic resistance becomes minimum.

Figure 3A:
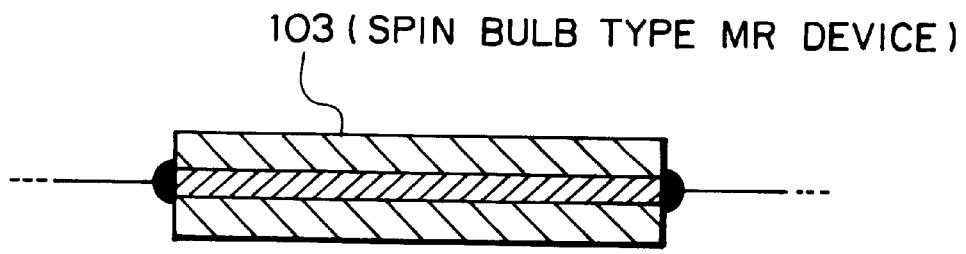
FIG. 3A is a schematic cross sectional view showing a conventional spin-bulb type MR device.
Figure 3B:
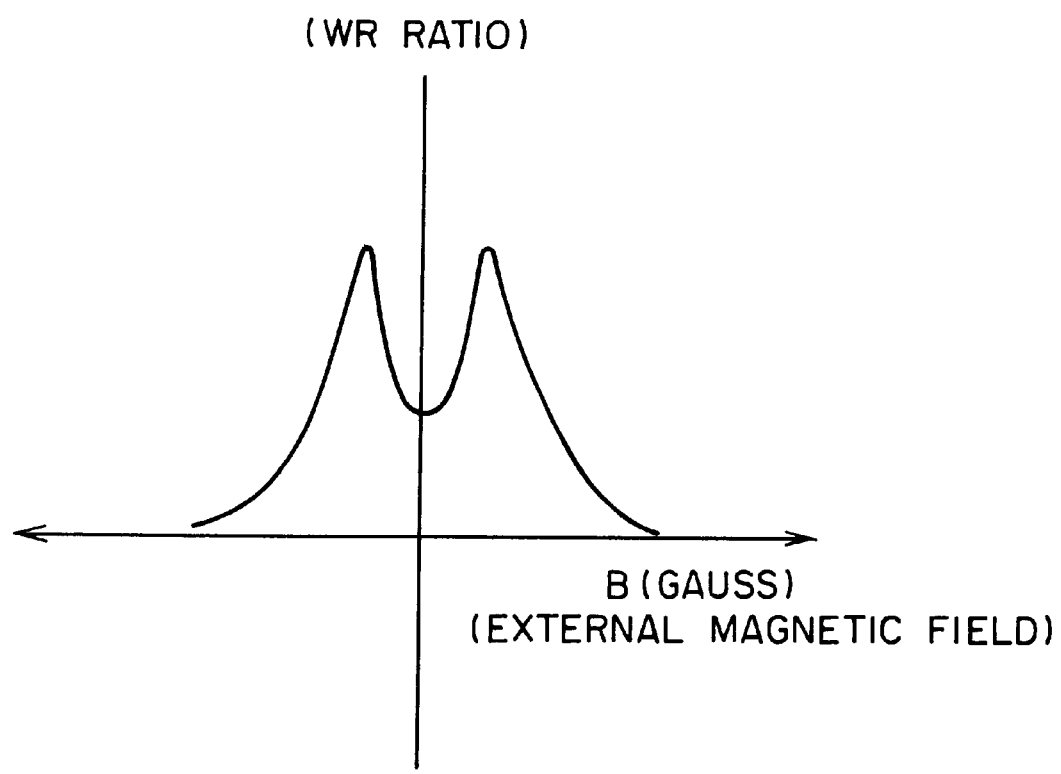
FIG. 3B is a diagram showing characteristic of the conventional MR device illustrated in FIG. 3A.

Next, a current flows in a plane of the three layer structure film by scattering the respective layers in the spin-bulb type MR device illustrated in FIG. 3A, In the event, when the current is scattered by the opposite parallel magnetic domain, the magneto-resistance effect takes place. In this event, the MR characteristic of the MR device in FIG. 3A is illustrated in FIG. 3B.

Figure 4A:
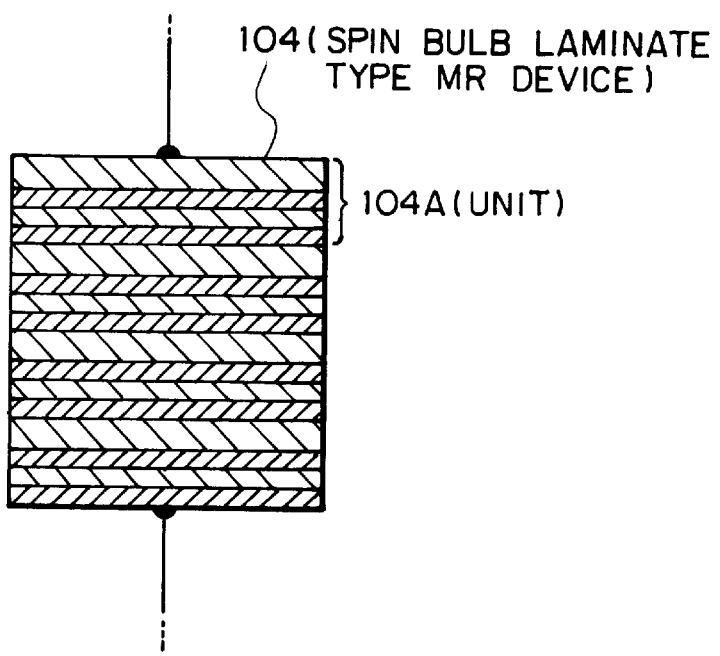
FIG. 4A is a schematic cross sectional view showing a conventional spin-bulb type lamination MR device.
Figure 4B:
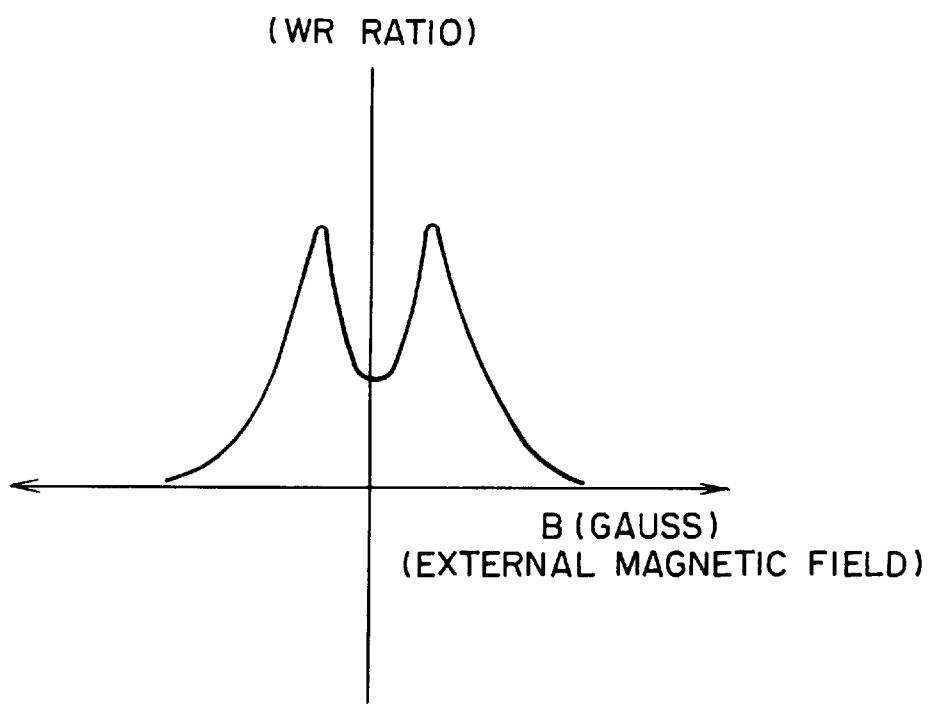
FIG. 4B is a diagram showing characteristic of the conventional MR device illustrated in FIG. 4A.

Subsequently, the spin-bulb laminate type MR device 104 is formed by combining the laminate type MR device (magnetic bulb type MR device) illustrated in FIG. 1A and the spin-bulb type MR device illustrated in FIG. 2A, as shown in FIG. 4A. Herein, the spin-bulb laminate type MR device 104 is structured by laminating magnetic materials which are different to each other in coercive force.

Further, the device characteristic is tried to be improved by changing a thickness of material of a coercive force layer and by interposing a tunnel barrier formed by an oxide aluminum.

However, ferromagnetic material, such as Fe, Co, and Ni, is precipitated in the non-magnetic electrical conductive layer in the conventional MR device of the granular type.

In this event, it is difficult to control a subtle difference of coercive force and precipitation particle density because the ferromagnetic material is naturally precipitated.

In consequence, it is difficult to keep uniformity in manufacturing, as mentioned before. As a result, the MR effect can not be essentially and sufficiently realized.

Further, a large GMR effect of 200% or more at maximum is observed in the MR device of the metal multi-layer type. However, it is difficult to process the device because a current flows in a direction perpendicular to a plane.

Moreover, the resistance of the device is extremely low (approximately, several tens macro-ohm) because a practical device has a size of 0.24 micron in the perpendicular direction for the plane at several tens micron square.

In addition, the external magnetic field of several tesla is required to reverse the magnetization, and this is not practical sensitivity.

Thus, there are a plurality of problems to put the MR device to practical use in the conventional MR devices, as described before.

Taking the above-mentioned problem into consideration, this invention provides an MR device which is capable of artificially and readily controlling a magnetic domain of nanometer size and which has high sensitivity and high gain.

EMBODIMENT

Figure 5:
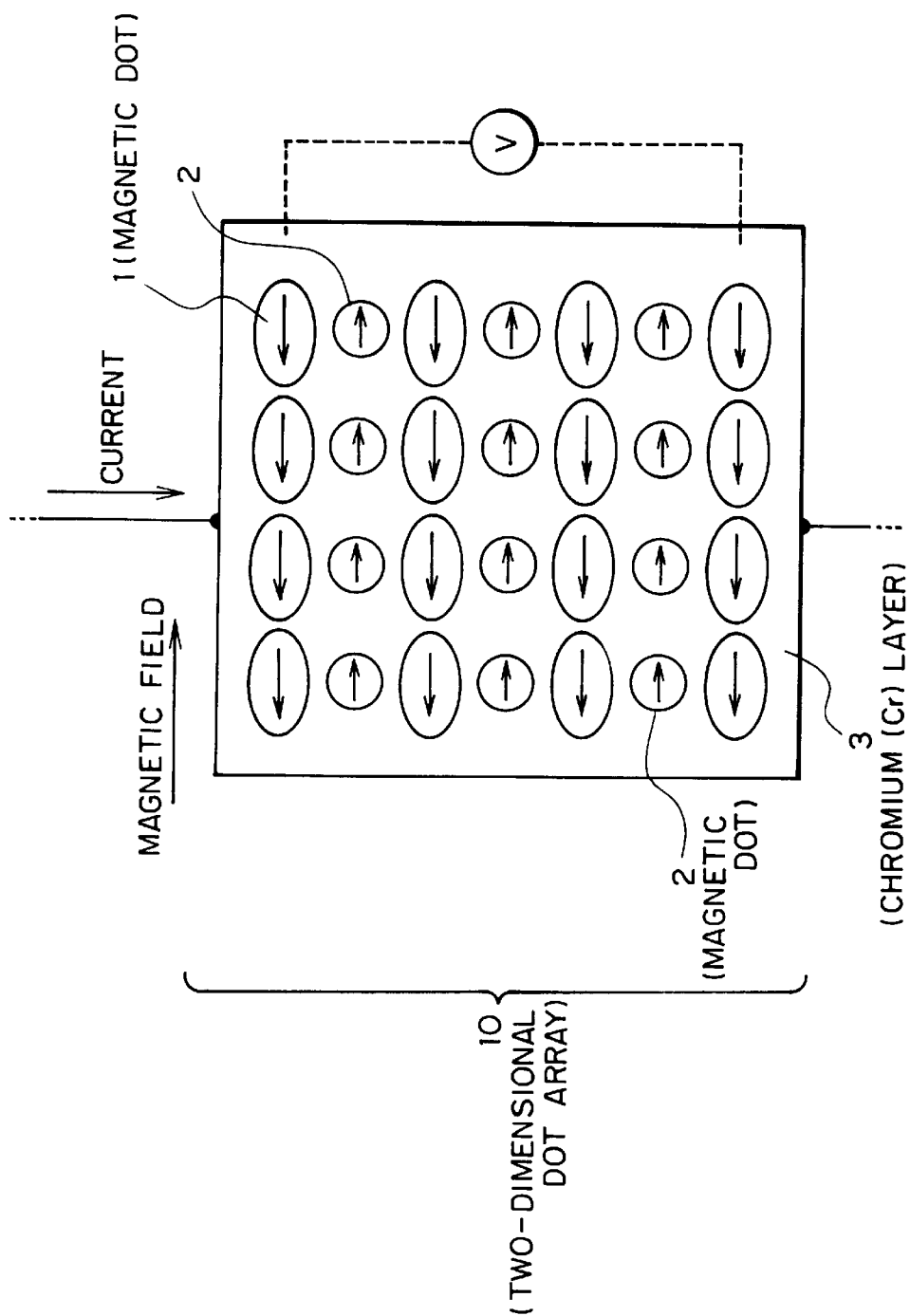
FIG. 5 is a schematic view showing an embodiment of this invention.

Referring to FIG. 5, description will be made about an MR device according to an embodiment of this invention.

In an MR device illustrated in FIG. 5, extremely fine dots (magnetic dots) 1 and 2 formed by magnetic material are arranged in a two-dimensional dot array 10.

Further, the two-dimensional dot array 10 is embedded or buried in an electric conductor (for example, an aluminum coating 23 illustrated in FIG. 6) which is formed by a non-magnetic electrode material. With such a structure, the magneto-resistance effect (MR effect) occurs by applying an external magnetic field.

It is effective to use a fine magnetic dot (for example, iron magnetization reverse dot) which readily reverses the magnetization under a weak magnetic field to improve MR (magneto-resistance effect) sensitivity for the external magnetic field. In this case, when the magnetic dot is several tens nm in size, one dot contains a single domain. Thereby, the magnetic dots 1 and 2 of a single domain can be realized, as shown in FIG. 5. The MR device having high sensitivity and high gain can be obtained by arranging the fine magnetic dots 1 and 2 in the array shape. In this event, the spin-moment of an electron has a longer distance as compared to general electron scattering. Namely, the spin-moment of the electron has a long spin diffusion length.

Now, when the electron of the up-spin enters into the magnetic domain of up-spin, the electron has a small magnetic scattering probability. Conversely, when the electron of the up-spin enters into the magnetic domain of the down-spin; the electron has a high magnetic scattering probability.

Further, when the electron moves in the MR device (extremely thin-film in which the dot-array is embedded or buried) during energizing, the electron moves with the electron scattering many times. This is observed as a normal electrical resistance. Moreover, the magnetic scattering in the magnetic domain (magnetic dots 1 and 2) is observed as the MR effect.

In this case, it is important to adopt a shape and arrangement of the dots which allows the magnetic scattering to occur effectively in the magnetic domain in order to effectively obtain the MR effect.

In this embodiment, the dots, which constitute the two-dimensional dot-array, are structured by two kinds of magnetic dots 1 and 2 having different shapes. Namely, the dots 1 and 2 are structured by the magnetic dot 1 of ellipse shape and the magnetic dot 2 of circular shape, as illustrated in FIG. 5. Thus, the MR device illustrated in FIG. 5 has the two-dimensional dot array structure in which the two kinds of magnetic dots 1 and 2 are alternately arranged.

Further, each magnetic dot 1 and 2, which constitutes the two-dimensional dot array 10, may be structured by two kinds of magnetic dots of different materials (different magnetic magnetization). In this event, the magnetic dots, which have different saturation magnetization, are alternately arranged in the two-dimensional array.

The two-dimensional dot array 10 is schematically illustrated in FIG. 5. In such a two dimensional dot array, the magnetic dots 1 and 2 having different saturation magnetization are alternately arranged. Herein, it is to be noted that the reference numeral 3 denotes a chromium (Cr) layer.

In FIG. 5, it is assumed that an external magnetic field is applied in the left direction, and as a result, all of magnetic dots 1 and 2 are completed in the left direction. Thereafter, even when no external magnetic field is applied, the direction of the magnetization is kept to be completed in the left direction because each of the magnetic dots 1 and 2 is formed by the ferromagnetic material, such as, iron.

Under such a circumstance, when the external magnetic field is applied in a right direction, the magnetization of the small circular magnetic dot 2 is first changed to the right direction because there is a difference regarding anisotropy of coercive force depending upon the dot shape. However, the magnetization of the magnetic dot 1 is not reversed because the magnetic dot 1 of the long ellipse shape has a high coercive force. This state is actually illustrated in FIG. 5. In this state, the spin scattering is largest.

The sensitivity of the MR device for the external magnetic field is determined by the external magnetic field which causes the magnetization reverse of the small magnetic dot 2 in the case of this device shape. In this event, it is possible to arbitrarily control the characteristic of the MR device in accordance with the arrangement of the dot array and the shape of the small magnetic dot (namely, magnetization reverse dot). Further, it is also possible to improve the MR efficiency by increasing the magnetic scattering with an increase of the dot density.

Moreover, the resistance of the MR device can be randomly controlled by a shape of the current path in the MR device formed by the two dimensional plane. Namely, it is possible to arbitrarily control the resistance of the MR device between low resistance and high resistance.

As to this point, it is difficult to process the device in the above-mentioned conventional laminate type MR device because the electron conduction in the perpendicular direction for the film plane is utilized. At the same time, the device resistance is extremely low (about several tens micro-ohm). In contrast, the dot array MR device according to this embodiment is excessively advantageous in matching with the other electronics circuits in the device resistance.

Moreover, it is possible to make the dot, which constitutes the dot array MR device, by combining two kinds or more of materials that are different in magnetic characteristic.

For instance, the MR effect same as that in FIG. 5 can be obtained when the dot array is structured by combining magnetic materials having different saturation magnetization rate, such as, permalloy with the same dot size, like the conventional laminate structure. In this event, it is effective to optimize the material and the dot shape to optimize the device characteristic.

Further, it is also effective to improve the MR characteristic when the extremely fine dot array is buried or embedded in the non-magnetic electrical conductor 21 (electrode material) illustrated in FIG. 6, and the electron tunnel barrier between the magnetic dots 1 and 2 and the electrical conductor 21 is formed in the MR device.

Moreover, the MR device characteristic is obtained in such a state that normal electron scattering and magnetic scattering are mixed in the MR device of the above embodiment. However, it is possible obtain further high MR effect by separating the electrical resistance component by the use of the tunnel effect.

The MR device having the tunnel barrier of the oxide aluminum is schematically illustrated in FIGS. 9A and 9B. The electron scattering effect can be removed from the resistance of the MR device by combining the respective dots 1 and 2 via the tunnel junction by the use of the doran method. In this event, the resistance of the MR device is mainly determined by junction resistance of the tunnel junction and resistance due to the magnetic scattering.

EXAMPLE

As illustrated in FIG. 5, the MR device is formed by vaporizing the chromium layer 3 on the dot devices 1 and 2 of the iron.

Referring to FIGS. 6A through 6F, description will be made about a detail example of manufacturing the MR device illustrated in FIG. 5.

First, a thin-film 22 of iron (Fe) having a thickness of 10 nm and a thin-film 23 of aluminum having a thickness of 2 nm are successively deposited on an oxide silicon substrate 21 by the use of the sputtering method, as illustrated in FIG. 6A.

Next, a resist-pattern 24 is formed on the aluminum thin film 23, as illustrated in FIG. 6B. In this event, the resist-pattern 24 is structured by forming a dot-pattern by the use of a super high resolution negative resist (calixarene) and the known electron beam lithography.

Subsequently, the resist-pattern 24 is transferred for the aluminum thin-film 23 by the known ECR etching using chlorine, as illustrated in FIG. 6C.

Thereafter, an oxide plasma ashing process is carried out in this state, as shown in FIG. 6D. Thereby, the organic resist 24 is removed. At the same time, the aluminum 23 below the resist is oxidized to form a hard mask for milling the iron thin-film 22 (magnetic dot 1 or 2) of a base layer. Further, the aluminum film 23 also serves as an insulating film for a surface of the iron film.

Subsequently, the magnetic dots 1 and 2 consisting of the iron film 22 are formed by the use of the thus-formed hard mask of the oxide aluminum by the Ar ion milling, as shown in FIG. 6E.

Successively, chromium thin-film 25 is deposited by the sputtering method on the surface of the device, as illustrated in FIG. 6F. Thus, the MR device of the two-dimensional dot array is completed.

In such a MR device, the large magnetic dot 1 of the iron film 22 has a long axis of 80 nm and a short axis of 30 nm in size while the small magnetic dot 2 of the iron film 22 has the long axis of 50 nm and the short axis of 30 nm in size.

In this condition, both the magnetic dots 1 and 2 are arranged with a pitch period of 100 nm. In this event, each magnetic dot 1 and 2 becomes a single magnetic domain in these dot sizes. In the large magnetic dot, a long axis points in a single direction and, further, the large dots are adjacent to each other in the direction along the long axis. Thereby, the magnetic dots 1 are magnetically and strongly coupled in the arranged direction. As a result, a strong one-axis anisotropy appears.

In contrast, in the short axis direction the large magnetic dots are further separated from each other. Consequently, the magnetic coupled force is weak in these directions.

On the other hand, the smaller magnetic dot 2 has a low anisotropy of axis length, and has an approximately circular form in shape. Consequently, the smaller magnetic dot 2 is magnetically soft.

More specifically, after the larger magnetic dot 1 is once magnetized in the long axis direction, the magnetization is not readily reversed even when the external magnetic field is turned over. However, the magnetization is readily reversed in the smaller magnetic dot 2 when the external magnetic field is turned over. In consequence, the GMR device having high sensitivity can be obtained.

Figure 7:
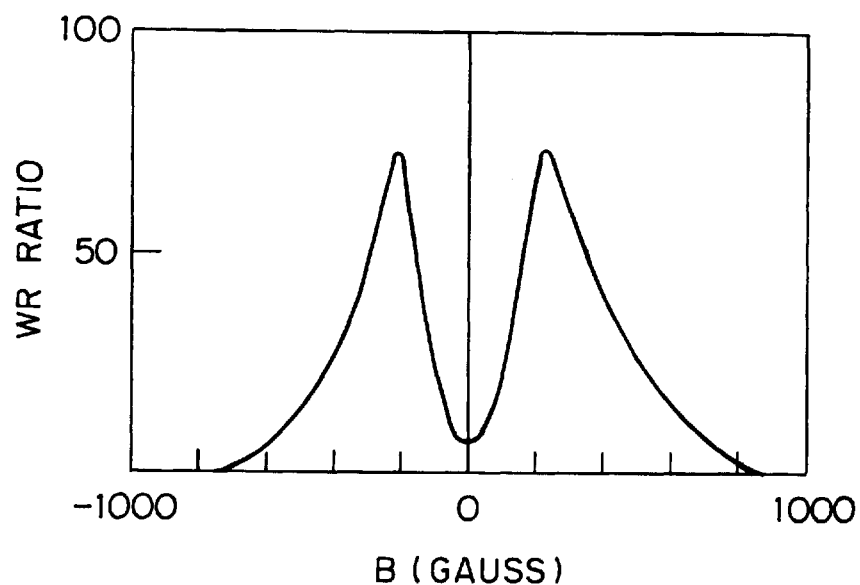
FIG. 7 is a diagram showing characteristic of the device illustrated in FIG. 5.
Figure 8:
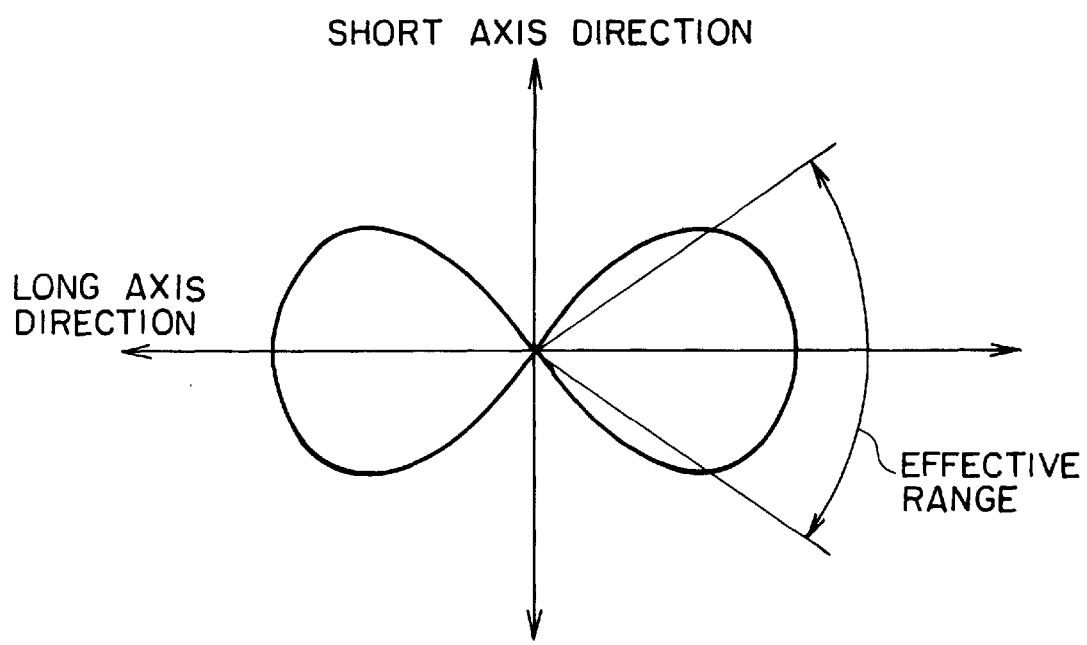
FIG. 8 is a diagram showing directional dependency for an external magnetic filed of the device illustrated in FIG. 5.

In the MR characteristic of the above-mentioned MR device, MR ratio of 80% can be realized under the magnetic field of 200 gauss, as illustrated in FIG. 7. Further, the directional anisotropy for the external magnetic field indicates the strong directional dependency for the GMR external magnetic field within the range (effective scope in FIG. 8) between +23 degree and −23 degree for the long axis direction of the dot.

Moreover, it is unnecessary that the shape of the magnetic dot is circular or ellipse. Alternatively, the MR device can be also realized by using the dot of a square shape or a triangle shape (not shown). In particular, the MR device using the magnetic dot of the triangle shape can have maximum of the sensitivity in an object direction three times for the sensitivity of the external magnetic field of the MR device.

The MR device having the triangle shape can have an applicable range for the device as compared to the MR device which uses the magnetic dot of the ellipse shape. This is because the MR device has the sensitivity maximum of two directions for the direction of the magnetic field.

Further, the external magnetic field corresponding to the magnetization reverse of the small dot 2 becomes the magnetic field sensitivity of the GMR device. In this event, it is possible to arbitrarily control the sensitivity characteristic by adjusting the shape anisotropy of the short axis or the long axis of the dot.

Moreover, the device operates by the electrical conduction in the surface plane different from the MR device of the laminate type in the MR device according to this embodiment.

In addition, the width of the device can be set considerably narrow in the MR device according to this embodiment. In consequence, the resistance of the device can be selected significantly high for the GMR device of the plane perpendicular type. Further, the thickness (the thickness of the chromium) of the device can be set to about 20 nm while the width of the device can be set to 2 micron.

Therefore, the resistance of the MR device according to this embodiment becomes several hundreds-ohms. In contrast, the device resistance is in the micro-ohms range in the laminate type conventional MR device. This is extremely advantageous in the matching with the LSI memory device.

Subsequently, description will be made about the other embodiment with reference with FIGS. 9 and 10.

The iron dots 30 (corresponding to reference numerals 1 and 2 in FIG. 5) as the magnetic dots in the dot array, are coupled to each other by tunnel junctions, as illustrated in FIGS. 9A and 9B. Thereby, the dot array is coupled as a network by the use of the tunnel junction. In this event, the dot array is fabricated by applying the known drawn method. Herein, it is possible to fabricate the device by a single the resist-process in the above drawn method. Therefore, the fabricating method has an excellent productivity.

In the FIGS. 9 and 10, a stencil-mask 38 is first formed by the use of the double layer PMMA resist or the Ge and MPPA resist. The PMMA or Ge (not shown), which is positioned at an upper portion, corresponds to the stencil mask 38, and is retained in the hollowness by the PMMA (not shown) that is positioned at a lower portion.

In FIG. 10, the reference numeral 38A denotes a penetration (an opening) for forming an iron dot 30A corresponding to the magnetic dot 1 having the large shape in FIG. 5. On the other hand, the reference numeral 38B denotes a penetration (an opening) for forming an iron dot 30A corresponding to the magnetic dot 2 having the small shape in FIG. 5.

First, the iron 30 consisting of the iron dot material is vertically vaporized on a substrate 50 via the stencil mask 38. Thereby, the iron dots 30 A (corresponding to the reference numerals 1 or 2) are formed as the magnetic dots.

Subsequently, aluminum 31 is vaporized from a left oblique direction. In such a vaporizing step of the aluminum 31, an aluminum coating 31A is formed on the iron dot 30A (corresponding to the magnetic dot 1 or 2 in FIG. 5) on the condition that the iron dot 30 A is half covered with aluminum using the stencil mask 38.

Successively, when oxygen is slightly introduced in vacuum atmosphere, a tunnel barrier of the aluminum oxide is formed on a surface of the aluminum coating 31A.

Next, when the aluminum 32 is vaporized from a right oblique direction as illustrated in FIG. 9A, the aluminum coating 31A and the aluminum coating 32A are connected via the tunnel barrier of the aluminum oxide. At the same time, the adjacent iron dots 30 A (corresponding to the magnetic dot 1 or 2) are wired to each other via the tunnel junction of the oxide between aluminum 31A and 32B.

This operation is repeated four times at total from left and right sides and from before and after. Consequently, the iron dots 30A (corresponding to the magnetic dot 1 or 2 in FIG. 5) having small and large sizes are coupled to each other with the network by the tunnel junction of the aluminum oxide. Thereby, the tunnel junction dot array is formed, illustrated in FIGS. 9A and 9B. In this event, the excellent GMR characteristic having low magnetic field can be realized by using this tunnel junction array.

As mentioned before, the MR device having extremely excellent characteristic can be manufactured by controlling the shape and the material of the dot. Further, the device characteristic can readily and arbitrarily be controlled when the magnetic dot and the aluminum coating 31A and 32A are formed.

Although the GMR device of the two-dimensional dot array itself is applied to a magnetic head or a magnetic sensor and the like, it may be applied for a random access memory of magnetic recording type (namely, M-RAM) other than them because silicon (Si) is compatible with the device.

What is claimed is:

1. A magneto-resistance effect device which includes a plurality of magnetic dots, each of which is formed by magnetic material on a substrate and where a magneto-resistance effect occurs by applying an external magnetic field, wherein:

said magnetic dots are arranged on said substrate in an array extending in two dimensions, said array having a plurality of rows along a column direction and a plurality of columns along a row direction; and said magnetic dots include first magnetic dots and second magnetic dots, said first magnetic dots being arranged on first rows and said second magnetic dots being arranged on second rows;

said first magnetic dots being different from said second magnetic dots in shape.

2. A device as claimed in claim 1, wherein:

said first magnetic dots and said second magnetic dots are alternately arranged along the column direction.

3. A device as claimed in claim 1, wherein:

said magnetic dots are buried in a non-magnetic electrical conductor.

4. A device as claimed in claim 3, wherein:

said non-magnetic electrical conductor comprises an aluminum layer.

5. A device as claimed in claim 3, wherein:

said magnetic dots which are buried in said non-magnetic electrical conductor are coated with a chromium layer.

6. A device as claimed in claim 3, wherein:

an electrical tunnel barrier is formed between said magnetic dots and said electrical conductor.

7. A device as claimed in claim 1, wherein:

said first magnetic dots are different from said second magnetic dots in size.

8. A device as claimed in claim 7, wherein:

said first magnetic dots are larger than said second magnetic dots.

9. A device as claimed in claim 8, wherein:

said first magnetic dots are formed by an ellipse shape while said second magnetic dots are formed by circular shape.

10. A device as claimed in claim 1, wherein:

all of said first and second magnetic dots are directed into a first row direction when a first magnetic field is applied as the external field, said first magnetic dots are directed into the first row direction and said second magnetic dots are directed into a second row direction opposite to the first row direction when a second magnetic field is applied as the external field.

11. A device as claimed in claim 10, wherein:

said first magnetic dots have a first coercive force while said second magnetic dots have a second coercive force, the first coercive force being larger than the second coercive force.

12. A device as claimed in claim 10, wherein:

said device has a sensitivity for said external magnetic field, the sensivity being determined by the second magnetic field.

13. A device as claimed in claim 10, wherein:

a predetermined current flows along the column direction in accordance with the first and second magnetic fields.

14. A device as claimed in claim 1, wherein:

said magnetic dots are coupled to each other via a tunnel junction.

15. A magneto-resistance effect device which includes a plurality of magnetic dots, each of which is formed by magnetic material on a substrate and where a magneto-resistance effect occurs by applying an external magnetic field, wherein:

said magnetic dots are arranged on said substrate in an array extending in two dimensions, said array having a plurality of rows along a column direction and a plurality of columns along a row direction; and said magnetic dots include first magnetic dots and second magnetic dots, said first magnetic dots being arranged on first rows and said second magnetic dots being arranged on second rows;

said first magnetic dots being different from said second magnetic dots in the magnetic material.

16. A device as claimed in claim 15, wherein:

the magnetic material comprises permalloy.

17. A magneto-resistance effect device which includes a plurality of magnetic dots, each of which is formed by magnetic material on a substrate and where a magneto-resistance effect occurs by applying an external magnetic field, wherein:

said magnetic dots are arranged on said substrate in an array extending in two dimensions, said array having a plurality of rows along a column direction and a plurality of columns along a row direction; and said magnetic dots include first magnetic dots and second magnetic dots, said first magnetic dots being arranged on first rows and said second magnetic dots being arranged on second rows;

said first magnetic dots being different from said second magnetic dots in saturation magnetization.

18. A method of manufacturing a magneto-resistance effect device having a substrate, comprising the steps of:

depositing an iron film on said substrate;

depositing an aluminum film on said iron film;

forming a resist-pattern on said aluminum film;

etching said aluminum film by the use of said resist-pattern to pattern said aluminum film;

removing said resist-pattern;

etching said iron film by using the patterned aluminum film as a mask so as to form a plurality of magnetic dots on said substrate in an array extending in two dimensions, and depositing a chromium film on a surface of said device.

19. A method of manufacturing a magneto-resistance effect device having a substrate, comprising the steps of:

positioning a mask which has a first opening corresponding to a first magnetic dot and a second opening corresponding to a second magnetic dot over said substrate;

vaporizing iron material via said mask in a perpendicular direction for said mask to form said first and second magnetic clots on said substrate in an array extending in two dimensions;

vaporizing first aluminum material via said mask from a left oblique direction for said mask to form a first aluminum layer on said first and second magnetic dots;

introducing oxygen for said first aluminum layer in vacuum atmosphere to form a tunnel barrier of an aluminum oxide on said first aluminum layer;

vaporizing second aluminum material via said mask from a right oblique direction for said mask to form a second aluminum layer on said first and second magnetic dots; and said first aluminum layer and said second aluminum layer being coupled via said tunnel barrier so that said first and second magnetic dots being wired via said tunnel barrier to each other.

20. A method as claimed in claim 19, wherein:

said first opening is different from said second opening in size.

* * * * *